United States Patent
von zur Muehlen et al.

(10) Patent No.: US 10,312,040 B2
(45) Date of Patent: Jun. 4, 2019

(54) MODULAR CIRCUIT PROTECTION SYSTEMS AND METHODS

(71) Applicant: EATON INTELLIGENT POWER LIMITED, Dublin OT (IE)

(72) Inventors: Patrick Alexander von zur Muehlen, Wildwood, MO (US); Michael Craig Henricks, Ballwin, MO (US); Joseph James Ventura, Eureka, MO (US); Vinicius Marcilli Petroni, Chesterfield, MO (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 61 days.

(21) Appl. No.: 15/234,196

(22) Filed: Aug. 11, 2016

(65) Prior Publication Data

US 2017/0330715 A1 Nov. 16, 2017

Related U.S. Application Data

(63) Continuation-in-part of application No. 15/151,680, filed on May 11, 2016.

(51) Int. Cl.
*H01H 39/00* (2006.01)
*H01H 9/30* (2006.01)
(Continued)

(52) U.S. Cl.
CPC .......... *H01H 39/006* (2013.01); *H01H 9/102* (2013.01); *H01H 9/106* (2013.01);
(Continued)

(58) Field of Classification Search
CPC .......... H01H 39/006; H01H 9/54; H01H 9/30; H01H 9/106; H01H 9/02; H01L 31/02; H01L 31/042; H02H 3/08
See application file for complete search history.

(56) References Cited

U.S. PATENT DOCUMENTS 4,029,921 A * 6/1977 Rich .................. H01H 33/6646
218/126
4,183,003 A * 1/1980 Cleveland .............. H01H 9/102
337/161
(Continued)

FOREIGN PATENT DOCUMENTS

DE 10049071 A1 * 4/2002 ............. H01H 39/00
DE 102009023801 A * 2/2010 ......... H01H 85/0241
DE 202010004061 U1 * 7/2010 ....... H01H 2071/086

OTHER PUBLICATIONS

Bornhorst Dieter, "Circuit protection device, especially in vehicles, has terminals protruding out of housing formed in one piece with conducting section inside housing forming preferred breakage point" Apr. 25, 2002, Micronas GmbH, Entire Document (Translation of DE10049071).*

(Continued)

*Primary Examiner* — Anatoly Vortman
*Assistant Examiner* — Stephen S Sul
(74) *Attorney, Agent, or Firm* — Armstrong Teasdale LLP

(57) ABSTRACT

A pyrotechnic circuit protection system includes a first connection terminal, a second connection terminal and a plurality of pyrotechnic modules connected between the first and second connection terminals. Each of the pyrotechnic modules includes a nonconductive housing and electrical connectors facilitating plug-in connection of the pyrotechnic modules to one another. A single control module may control and coordinate a plurality of pyrotechnic disconnect modules.

21 Claims, 15 Drawing Sheets

(51) Int. Cl.
    *H01H 9/54* (2006.01)
    *H02H 3/08* (2006.01)
    *H01H 9/10* (2006.01)
    *H01L 31/02* (2006.01)
    *H01L 31/042* (2014.01)

(52) U.S. Cl.
    CPC .............. *H01H 9/30* (2013.01); *H01H 9/54* (2013.01); *H01L 31/02* (2013.01); *H01L 31/042* (2013.01); *H02H 3/08* (2013.01)

(56) References Cited

U.S. PATENT DOCUMENTS

| | | | | |
|---|---|---|---|---|
| 4,646,640 | A * | 3/1987 | Florin | F42D 1/055 102/217 |
| 5,704,811 | A * | 1/1998 | Hsu | H01R 13/68 337/198 |
| 5,969,932 | A * | 10/1999 | Ryan | G08B 1/08 361/118 |
| 6,204,747 | B1 * | 3/2001 | Kitchens | H01H 37/761 337/407 |
| 2008/0137253 | A1 * | 6/2008 | George | H01H 9/106 361/93.1 |
| 2010/0090851 | A1 * | 4/2010 | Hauser | H01R 25/003 340/657 |
| 2010/0197157 | A1 * | 8/2010 | Wang | H01R 13/447 439/275 |
| 2012/0127621 | A1 * | 5/2012 | Knapp, Jr. | H02H 3/093 361/94 |
| 2013/0269746 | A1 * | 10/2013 | Ramsey | H01L 31/05 136/244 |
| 2016/0189905 | A1 * | 6/2016 | Lanning | H01H 85/14 337/159 |
| 2017/0004947 | A1 * | 1/2017 | Hong | H01H 85/38 |
| 2017/0330714 | A1 * | 11/2017 | von zur Muehlen | H01R 21/76 |

OTHER PUBLICATIONS

Virgin Jean-Marc, "Safety device for disconnecting high voltage battery in e.g. electric vehicle from electric circuit during short circuit, has safety fuse connected parallel to pyrotechnical fuses, and series resistor connected upstream to safety fuse", Feb. 4, 2010, Daimler AG, Entire Document (Translation of DE102009023801).*
"Elektrisch koppelbares Installationsgerät", Jun. 24, 2010, Theben AG, Entire Document (Translation of DE202010004061).*

* cited by examiner

MODULAR CIRCUIT PROTECTION SYSTEMS AND METHODS

CROSS REFERENCE TO RELATED APPLICATIONS

This application is a continuation-in-part application of U.S. patent application Ser. No. 15/151,680 filed May 11, 2016, the complete disclosure of which is hereby incorporated by reference in its entirety.

BACKGROUND OF THE INVENTION

The field of the invention relates generally to electrical circuit protection devices and related systems and methods, and more specifically to pyrotechnic circuit protection devices and related systems and methods.

Pyrotechnic circuit protection devices are known that include terminals for connection to a circuit and a pyrotechnic disconnect feature that releases energy to disconnect the terminals inside the device. The pyrotechnic disconnect feature may include stored chemical, electrical or mechanical energy that is released via actuation of a pyrotechnic charge to sever an electrical connection between the terminals of the device. As such, pyrotechnic circuit protection devices are sometimes referred to as pyrotechnic disconnects or pyrotechnic switches. Once activated, such devices can electrically isolate load-side circuitry from line-side circuitry through the pyrotechnic circuit protection device when predetermined fault conditions occur in the line-side circuitry and prevent possible damage to load-side circuitry that the fault condition may otherwise present.

Pyrotechnic circuit protection devices are advantageous for their quick and reliable operation regardless of the energy (voltage and current) in the circuit completed through the device when fault conditions are identified. This is because the energy needed to open the device comes from a chemically stored source in the pyrotechnic unit rather than the energy of the circuit fault (as in fusible circuit protector) or from stored mechanical energy (as in conventional circuit breaker devices).

Known pyrotechnic circuit protection devices remain disadvantaged in some aspects, however, that to date have limited their use to a relatively small set of niche applications. Improvements are desired.

BRIEF DESCRIPTION OF THE DRAWINGS

Non-limiting and non-exhaustive embodiments are described with reference to the following Figures, wherein like reference numerals refer to like parts throughout the various views unless otherwise specified.

DETAILED DESCRIPTION OF THE INVENTION

Figure 1:
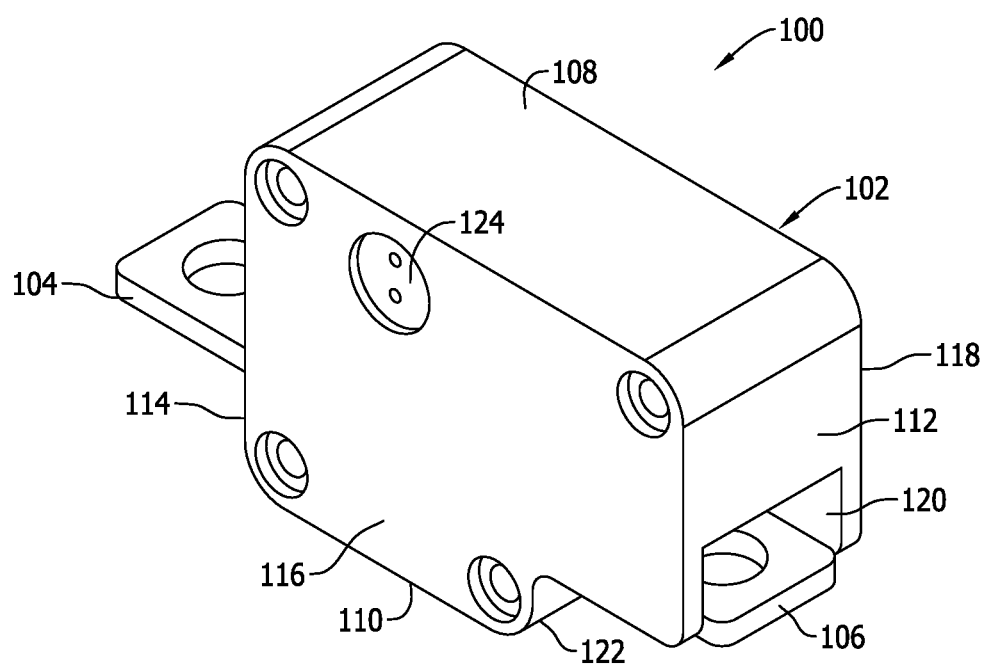
FIG. 1 is a first perspective view of an exemplary embodiment of a pyrotechnic circuit protection module according to the present invention.

In order to understand the present invention to its fullest extent, a discussion of the state of the art of pyrotechnic circuit protection devices and its limitations is described below, followed by a discussion of exemplary embodiments of the present invention that address and overcome those limitations and beneficially satisfy longstanding and unfulfilled needs in the art.

Conventional pyrotechnic circuit protection devices tend to be disadvantaged in certain aspects that have until now been an impediment to their widespread use and adoption. Instead, conventional pyrotechnic circuit protection device tend to be employed only in certain niche applications.

For example, known pyrotechnic circuit protection devices tend to be limited to relatively low voltage applications (typically 70V or less) and relatively low current applications (typically 100 A or less). For voltage and current applications outside this range, conventional pyrotechnic circuit protection devices are generally not considered.

Pyrotechnic circuit protection devices require an external actuation source and a monitoring system to detect fault conditions and activate the pyrotechnic disconnect feature. Providing actuation sources and monitoring systems and connecting them to the pyrotechnic circuit protection devices can be impractical and inconvenient relative to other types of circuit protection devices. Such issues are multiplied over the number of pyrotechnic circuit protection devices needed to protect desired circuitry.

Conventional pyrotechnic circuit protection devices generally do not include arc mitigation elements, so for higher voltage systems another circuit protection device (typically a fuse) is often used in parallel to pyrotechnic circuit protection device. This increases the cost and expense of implementing pyrotechnic circuit protection devices, and is multiplied over the number of pyrotechnic circuit protection devices needed to protect desired circuitry.

Finally, pyrotechnic circuit protection devices tend to be expensive to develop for specific applications, and are not compatible with existing circuit protection accessories such as fuse holders, fuse blocks, etc. that accommodate fuses and facilitate ease of connection to electrical circuits. Without a great deal of effort and analysis to determine the correspondence between pyrotechnic circuit protection devices and other circuit protection devices they are not easy to use as a drop-in replacement to other types of circuit protectors such as fuses.

Exemplary embodiments of the present invention are described below that beneficially overcome these and other disadvantages in the art. As explained in detail below, modular pyrotechnic circuit protection devices are proposed for use in combination with modular pyrotechnic control modules that provide an easily configurable system that may be readily used with standard fuses, terminals, controllers and other components to meet a wide variety of circuit protection specifications and needs at relatively low cost and with general compatibility with established circuit protection fuse classes and related devices. Method aspects will be in part apparent and in part explicitly discussed in the description below.

Figure 2:
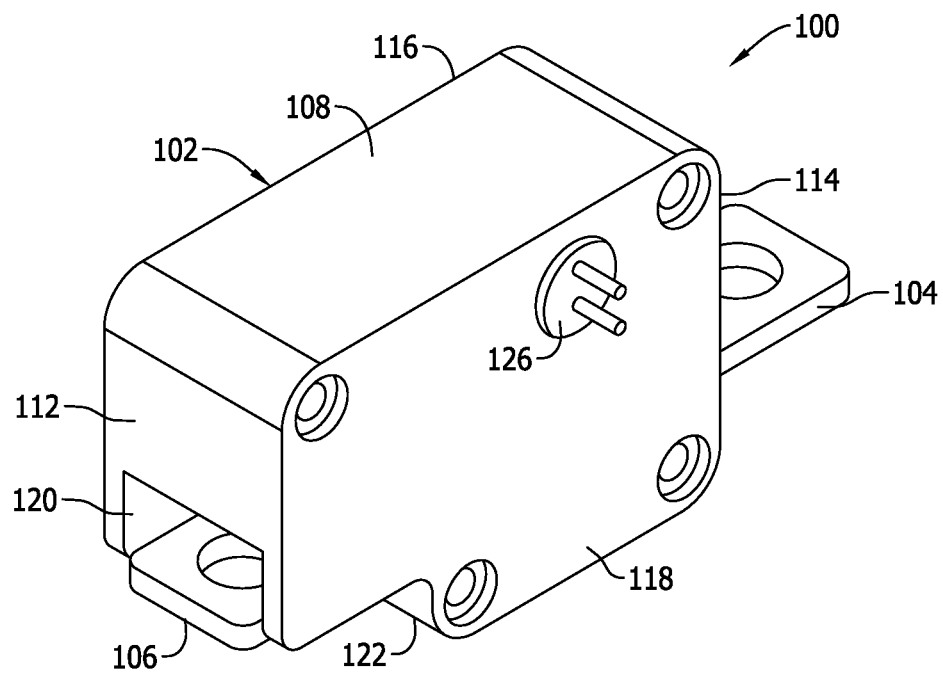
FIG. 2 is a second perspective view of the pyrotechnic circuit protection module shown in FIG. 1.

FIGS. 1 and 2 are perspective views of an exemplary embodiment of a pyrotechnic circuit protection module, referred to herein as a pyrotechnic disconnect module 100 according to the present invention. The pyrotechnic disconnect module 100 generally includes a nonconductive housing 102 and first and second terminals 104, 106 extending from and exposed on opposing sides of the housing 102. The terminals 104, 106 provide a connection structure to external circuitry, and in the example shown the terminals 104, 106 are flat terminals including a mounting aperture that may provide, for example, connections to terminal studs of a power distribution block, or bolt-on connection to a another conductor. Other types of terminals known in the art may likewise be used instead in other alternative embodiments. Also, in other embodiments, the terminals 104, 106 instead of being the same type as in the example shown may be different types relative to one another. It is also understood that in another embodiment the terminals 104, 106 may project from or be exposed by other locations in the housing 102, including but not limited to an embodiment wherein the terminals 104, 106 extend from the same side of the housing 102.

In the example shown, the housing 102 has a generally rectangular shaped outer profile defined by a top face or surface 108, a bottom face or surface 110 opposing the top surface 108, lateral side faces or surfaces 112, 114, and longitudinal side faces or surfaces 116, 118. A recess 120 is formed adjacent the terminal 106 on the lateral surface 112 and a portion of the housing 102 overhangs the terminal 106 on the lateral side 112, while a clearance or cutout 122 is formed in the housing 102 beneath the terminal 106 on the lateral side 112. The terminal 104, however, projects away from the housing at the opposing side without an overhang or cutout formed in the housing 102 at the lateral side 114. The housing 102 accordingly has an asymmetrical shape in the example shown. Other geometric shapes and geometries, including symmetrical shapes, are possible in other embodiments.

As also shown in FIGS. 1 and 2, the longitudinal sides 116, 118 of the pyrotechnic disconnect module 100 each include respective electrical connectors 124, 126 exposed thereon. In the example shown, the connector 124 is a female connector and the connector 126 is a male connector. The connectors 124, 126 in the illustrated example, generally oppose one another and are in-line with one another in the same location vis-à-vis the opposing sides 116, 118 of the pyrotechnic disconnect module 100. That is, the connectors 124, 126 are located at the same elevation and spacing from the respective sides 108, 114 of the housing 102. As such, aligned pyrotechnic disconnect modules 100 can be electrically connected to one another via the male connector 126 on a first pyrotechnic disconnect module 100 and a female connector 124 on a second pyrotechnic disconnect module 100 using a plug and socket-type engagement.

When the respective electrical connectors 124, 126 of two adjacent pyrotechnic disconnect modules 100 are joined and mated as in the example systems described below, electrical interconnection of the pyrotechnic disconnect modules 100 is established for control and coordination purposes described below in a pyrotechnic circuit protection system. While exemplary male and female connectors 126, 124 are shown at exemplary locations in the pyrotechnic disconnect 100 and also while a two prong male connector 126 and a two aperture female connector 124 are provided, other types of male and female connectors 126 may be utilized in other embodiments, whether in the same or different locations on the housing 102, in other embodiments.

The electrical connector 124 and 126 in each pyrotechnic module 100 is electrically connected via the first male prong and the first mating aperture to a pyrotechnic disconnect element 128 (FIG. 5) inside the module housing 102. The pyrotechnic disconnect element 128 may be activated by control circuitry in the manner described below to release stored energy inside the module 100 in a known manner to open or disconnect a conductive circuit path between the terminals 104, 106 in a known manner. Generally, any known type of pyrotechnic element 128 and associated type of energy storage element (e.g., chemical, electrical, mechanical) known in the art may be utilized inside the pyrotechnic disconnect module 100.

A power supply and electronic control circuit 130 (FIG. 5) may also be included in the pyrotechnic disconnect module 100. When a trigger command is received by the control circuit 130 via one of the connectors 124, 126 the pyrotechnic element 128 is activated by the power supply to cause the energy to be released that, in turn, opens or disconnects the terminals 104, 106 of the module 100.

The control circuitry of the module 100 may include a processor-based microcontroller including a processor and a memory storage wherein executable instructions, commands, and control algorithms, as well as other data and information required to satisfactorily operate as described are stored. The memory of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based" microcontroller shall refer not only to controller devices including a processor or microprocessor as shown, but also to other equivalent elements such as microcomputers, programmable logic controllers, reduced instruction set (RISC) circuits, application specific integrated (ASIC) circuits and other programmable circuits, logic circuits, equivalents thereof, and any other circuit or processor capable of executing the functions described herein. The processor-based devices listed above are exemplary only, and are thus not intended to limit in any way the definition and/or meaning of the term "processor-based".

The power supply for the control circuit 130 in contemplated embodiments may be line voltage (either separately supplied or derived from the circuitry protected with the pyrotechnic circuit protection module 100), an isolated power supply, or may employ one or more power harvesting supplies. Potential power sources and supplies in contemplated embodiments also include the use of power resistors to limit AC line voltage, rectified AC line voltages, voltage regulators, voltage drops across Zener diodes, voltage drop across power capacitors or supercapacitors, and/or a battery power supply or battery bank. Renewable energy sources such as solar power and wind power may also be utilized.

A pass through electrical connection is also established in the housing 102 via the connectors 124 and 126 of each pyrotechnic disconnect module 100 for the purposes described below. A number of pyrotechnic disconnect modules 100 may therefore be electrically connected to one another in a daisy chain arrangement vis the connectors 124, 126 provided, and a continuity check can be made through the connected string of pyrotechnic disconnect modules 100 to verify and account for all connected pyrotechnic disconnect modules 100 via the second prong and the second aperture in the connectors 126 and 124. Activation signals may be sent via the connectors 124, 126 from a control module described below to activate the pyrotechnic disconnect element 128 in each module 100 individually in an independent manner, or to activate the respective pyrotechnic elements 128 in the connected modules 100 simultaneously as desired.

Figure 3:
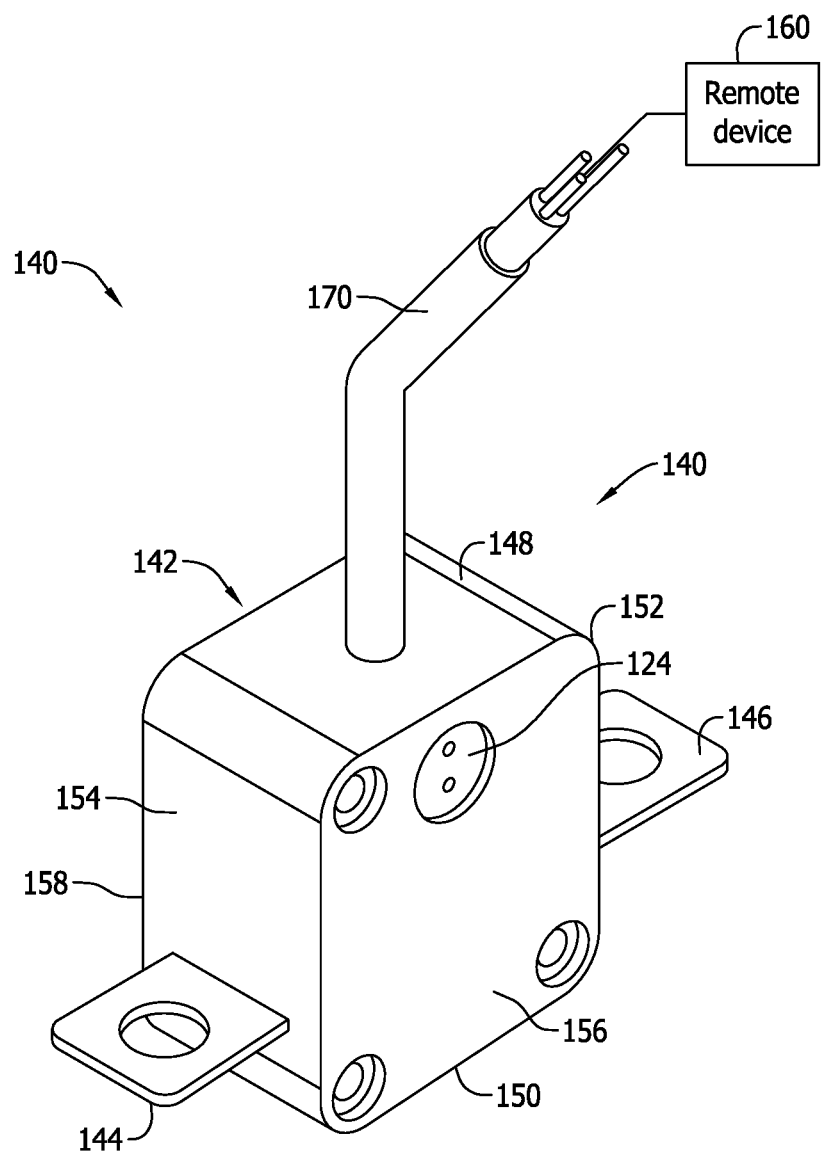
FIG. 3 is a perspective view of an exemplary embodiment of a pyrotechnic control module for use with the pyrotechnic circuit protection device module in FIGS. 1 and 2 according to the present invention.

FIG. 3 is a perspective view of an exemplary embodiment of a modular pyrotechnic control module 140 for use with the pyrotechnic circuit protection device module(s) 100 (FIGS. 1 and 2).

The pyrotechnic control module 140 generally includes a nonconductive housing 142 and first and second terminals 144, 146 extending from and exposed on opposing sides of the housing 142. The terminals 144, 146 provide a connection structure to external circuitry, and in the example shown the terminals 144, 146 are flat terminals including a mounting aperture that may provide, for example, connections to terminal studs of a power distribution block, or bolt-on connection to a another conductor. The terminals 144, 146 are similar to the terminals 104, 106 of the pyrotechnic disconnect module 100 described above. Other types of terminals known in the art may likewise be used instead in other alternative embodiments, and the terminal structure in the pyrotechnic control module 140 need not be the same as the terminal structure in the pyrotechnic disconnect module(s) 100 in all embodiments. Also, in other embodiments, the terminals 144, 146 instead of being the same type as in the example shown may be different types relative to another. It is also understood that in another embodiment the terminals 144, 146 may project from or be exposed by other locations in the housing 142 of the module 140, including but not limited to an embodiment wherein the terminals 144, 146 extend from the same side of the housing 142.

In the example shown, the housing 142 of the pyrotechnic control module 140 has a generally rectangular shaped outer profile defined by a top face or surface 148, a bottom face or surface 150 opposing the top surface 148, lateral side faces or surfaces 152, 154, and longitudinal side faces or surfaces 156, 158. Unlike the housing 102 of the pyrotechnic disconnect module 100, the housing 142 of the pyrotechnic control module 140 has a symmetrical shape in the example shown. The sides 156, 158 of the control module housing 142 are generally square sides having edges of approximately equal length, whereas the sides 116, 118 of the pyrotechnic disconnect module housing 102 include side edges of substantially different length. Other geometric shapes and geometries, including asymmetrical shapes of the control module 140, are possible in other embodiments. It is noted that the shape and profile of the pyrotechnic control module 140 is visibly different from the pyrotechnic circuit protection module 100 (FIGS. 1 and 2) in both shape and proportion so that the two pyrotechnic modules 100, 140 can be readily identified and distinguished in use. Beneficially, the two modules 100, 140 cannot easily be mistaken for one another in assembling the modules into a system such as those described below.

The pyrotechnic control module 140 includes an electrical connector in the form of a two aperture female connector 124 on one of the lateral sides 156, 158 of the housing 142. The connector 124 is located at the same elevation as the corresponding connector 124 in the pyrotechnic disconnect module 100. Using the connector 124, the control module 140 may be aligned side-by-side with and be connected to a pyrotechnic circuit protection module 100 via the connector 126 of the module 100 to configure a pyrotechnic circuit protection system as further described below. The control module 140, however, may alternatively include the male connector 126 instead of the female connector 124 in the embodiment shown. Further, in still another embodiment the control module 140 could include male and female connectors on opposing sides thereof, either of which could be connected to one of the pyrotechnic circuit protection modules 100.

The control module 140 may be a processor-based device communicating with a remote device 160 via a wire or cable 170. The remote device 160 may input signals to the control module 140 or may be responsive to output signals from the control module 140. The control module 140 may include a processor-based microcontroller including a processor and a memory storage wherein executable instructions, commands, and control algorithms, as well as other data and information required to satisfactorily operate as described. The memory of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM).

As used herein, the term "processor-based" microcontroller shall refer not only to controller devices including a processor or microprocessor as shown, but also to other equivalent elements such as microcomputers, programmable logic controllers, reduced instruction set (RISC) circuits, application specific integrated (ASIC) circuits and other programmable circuits, logic circuits, equivalents thereof, and any other circuit or processor capable of executing the functions described herein. The processor-based devices listed above are exemplary only, and are thus not intended to limit in any way the definition and/or meaning of the term "processor-based".

The remote device 160 in one embodiment may be a monitoring system that in a known manner detects electrical fault conditions (e.g., electrical overcurrent conditions) in the circuitry connected to one or more of the pyrotechnic circuit protection modules 100. The monitoring system in such a scenario may be a separately provided processor-based device in communication with voltage sensors, current sensors or other sensors for detecting electrical fault detections. Other possible sensors for detection of fault conditions may include thermal sensors, vibration sensors, pressure sensors, acoustic sensors, fluid sensors, and light sensors. Signal inputs from one or more sensors such as those above may be received and compared by the monitoring system to predetermined trigger command set points or thresholds to determine whether or not to activate a pyrotechnic circuit protection module 100. If inputs from the sensors are below the applicable thresholds no fault conditions are determined to exist and the signal inputs will continue to be monitored. On the other hand, as inputs from the sensors reach or exceed the applicable thresholds, electrical fault conditions are determined to exist and trigger commands may be sent from the monitoring system 160 to the control module 140 via the cable 170. The control module 140 may then communicate the trigger signal to the affected pyrotechnic circuit protection module(s) 100.

In another contemplated embodiment, the comparison(s) of sensed values to trigger set point values may be made by the control module 140 itself based on supporting data from the remote device 160, or still alternatively based upon its own sensing or monitoring capability. For instance, the pyrotechnic control module 140 may monitor electrical conditions sensed across another element in the circuit (e.g., one or more electrical fuses such as the fuse 208 (FIGS. 4 and 5)), and based on the monitored conditions make the comparison to predetermined trigger set points and when necessary issue trigger commands. Various different techniques of monitoring circuit conditions across a fuse using voltage and current sensing circuitry to detect electrical fault conditions are known and may be utilized by the pyrotechnic control module 140.

Once electrical fault conditions are determined as described above, whether by the control module 140 itself or by the remote device 160, the control and actuation module 140 sends an activation signal to one or more of the pyrotechnic circuit protection modules 100 so that disconnection through the pyrotechnic circuit protection module(s) 100 can be effected to protect connected circuitry on the load side. Notification signals or messages can be sent from the pyrotechnic control module 140 to the remote device 160 so that further appropriate actions can be taken in response to the pyrotechnic disconnections made, including but not limited to generation of notices or alerts to responsible personnel so that the circuitry may be restored by replacing the activated and opened pyrotechnic disconnection modules.

To summarize, and in view of the above, in contemplated embodiments, electrical fault detection and determination may be undertaken externally by the remote device 160, may be undertaken by another device or system and communicated to the control module 140 by the remote device 160, may be detected and determined by the control module 140 itself, or in some cases, trigger command signals may also be generated manually or programmed by another system or equipment associated with the electrical power system. As such, the control module 140 may be responsive to actions taken by a person or other equipment in a proactive manner, regardless of whether or not fault conditions may actually be present at the pyrotechnic disconnect module 100.

To facilitate communication between the control module 140 and an external device 160, the wire or cable 170 in contemplated embodiments may include a ground conductor to support control electronics in the remote device 160 and/or in the control module 140. The cable 170 may also include an input signal conductor for communication of command signals and data to the control module 140 as well as test and diagnostic signals on the same signal wire or an additional signal wire in the cable 170. When trigger command signals are received by the control module 140 over the cable 170, the control module 140 can output trigger command signals to one or more of the connected pyrotechnic circuit protection modules 100 via the connector 124 of the control module 140. As such, a single control module 140 may coordinate and control a plurality of pyrotechnic circuit protection modules 100, as well as communicate with the remote device 160.

The control module 140 in contemplated embodiments may be powered by line voltage (either separately supplied or derived from the circuitry protected with the pyrotechnic circuit protection modules 100), an isolated power supply, or by utilizing known power harvesting technologies. Potential power sources and supplies in contemplated embodiments also include the use of power resistors to limit AC line voltage, rectified AC line voltages, voltage regulators, voltage drops across Zener diodes, voltage drop across power capacitors or supercapacitors, and/or a battery power supply or battery bank. Renewable energy sources such as solar power and wind power may also be utilized.

Figure 4:
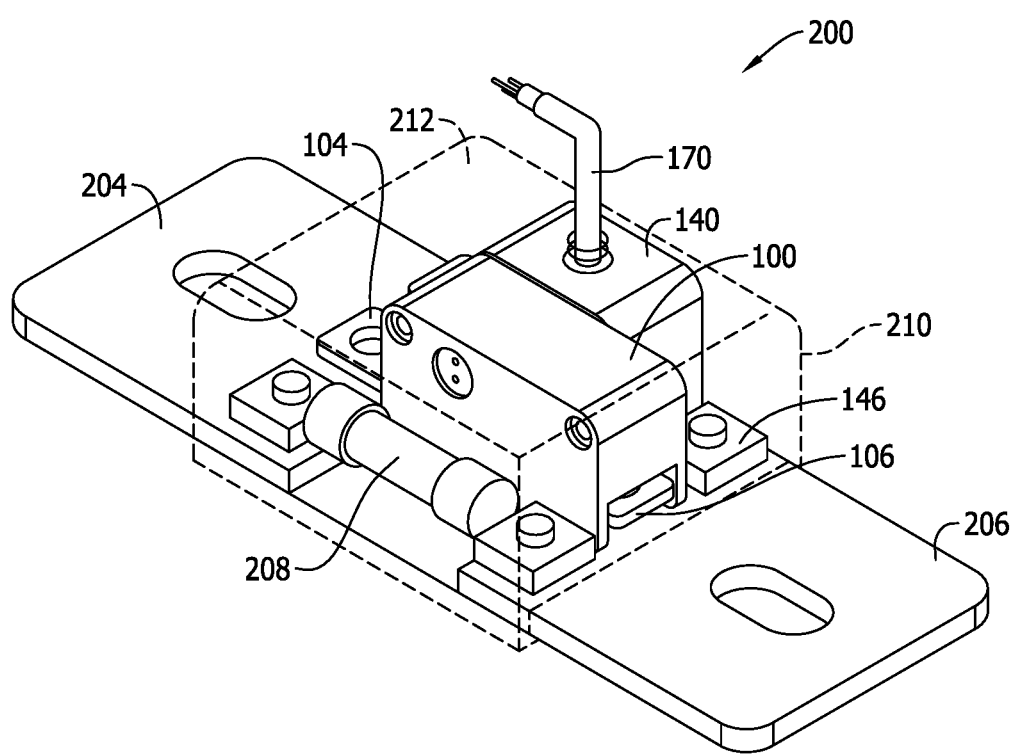
FIG. 4 is a perspective view of a first exemplary embodiment of a pyrotechnic circuit protection system according to the present invention including the pyrotechnic circuit protection module of FIGS. 1 and 2 and the pyrotechnic control module shown in FIG. 3.
Figure 5:
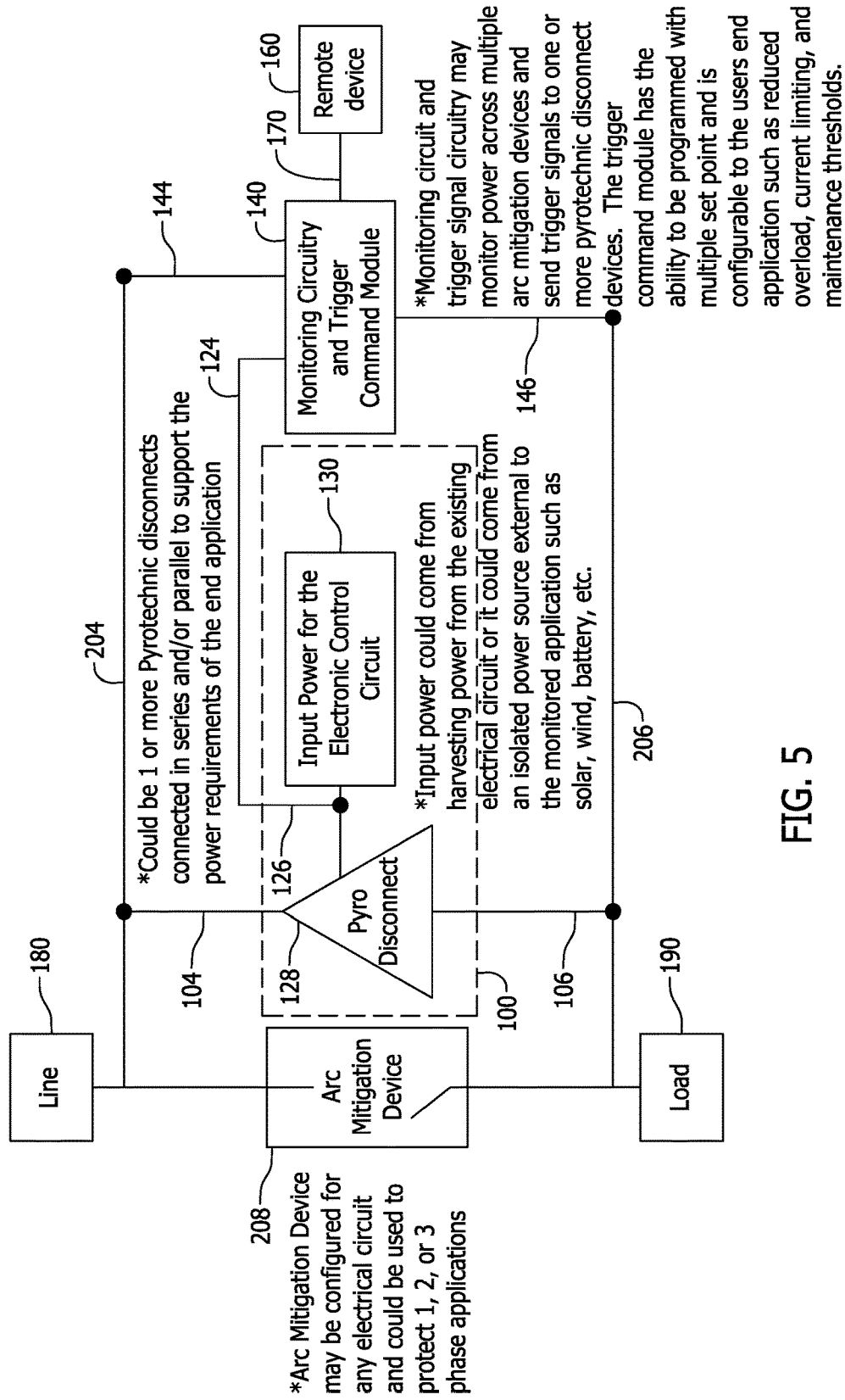
FIG. 5 is a block diagram of the exemplary system shown in FIG. 4.

FIG. 4 is a perspective view of a first exemplary embodiment of pyrotechnic circuit protection system 200 according to the present invention, and FIG. 5 is a block diagram of the system 200. The system 200 as shown includes one pyrotechnic disconnect module 100 and one pyrotechnic control module 140. The modules 100 and 140 are positioned side-by-side and are mechanically and electrically interconnected by the respective female connector 124 (FIG. 3) of the module 140 and the male connector 126 (FIG. 2) of the module 100 with plug-in connection. Bus bars 204, 206 are connected to the terminals 106, 104 of the module 100 and to the terminals 144, 146 of the module via bolt connections, and the bus bars 204, 206 may in turn be connected to external circuitry in a similar manner. As seen in FIG. 5, the bus bar 204 may be connected to line-side or power supply circuitry 180, and the bus bar 206 may be connected to load-side circuitry 190. In other embodiments terminals other than bus bars may be utilized to make such connections, including terminal screw connectors, soldered connections, brazed connections or other connection techniques known in the art using known fasteners and the like.

The system 200 also includes a high voltage, low amperage fuse 208 for arc quenching purposes when the pyrotechnic circuit protection module 100 is activated to disconnect or open an electrical connection between the terminals 104, 106. The fuse 208 is connected to the bus bars 204, 206 via terminal elements similar to those shown for the modules 100, 140. The fuse 208 establishes a current path in electrical parallel to the pyrotechnic circuit protection module 100. When the circuit path between the terminals 104, 106 of the pyrotechnic circuit protection module 100 is opened, current is then diverted through the fuse 208. The fuse 208 includes an arc extinguishing media or other arc quenching feature to dissipate electrical arcing potential inside the fuse 208 as the fusible element therein opens. By this arrangement, the pyrotechnic circuit protection module 100 need not itself include arc mitigation features.

In normal operation, when no electrical fault condition exists, the pyrotechnic circuit protection module 100 provides a low resistance circuit path between its terminals 104, 106. The fuse 208, however, exhibits a relatively higher electrical resistance, and as such very little current will flow through the fuse in normal conditions. Instead, almost all of the current in normal conditions will flow through the pyrotechnic circuit protection module 100. Depending on the circuitry being protected and its electrical arcing potential, the fuse 208 may in some instances be considered optional and may be omitted in the system 200.

A housing base 210 and housing cover 212 may be provided as shown to protect the components of the system 200 when interconnected as shown. The base 210 defines a receptacle sized and dimensioned to receive the modules 100, 140 and the arc mitigation fuse 208. The cover 212 in the example shown includes an aperture through which the cable 170 may pass. The cover 212 may in some embodiments be transparent. In other embodiments, the cover 212 may be color coded to convey to a person the type of disconnect modules 100 included without having to open the cover 212 for inspection. While an exemplary housing is shown and described, other variations of housings are possible and may be utilized as desired. In certain embodiments, the housing may be considered optional and may be omitted in the system 200.

Figure 6:
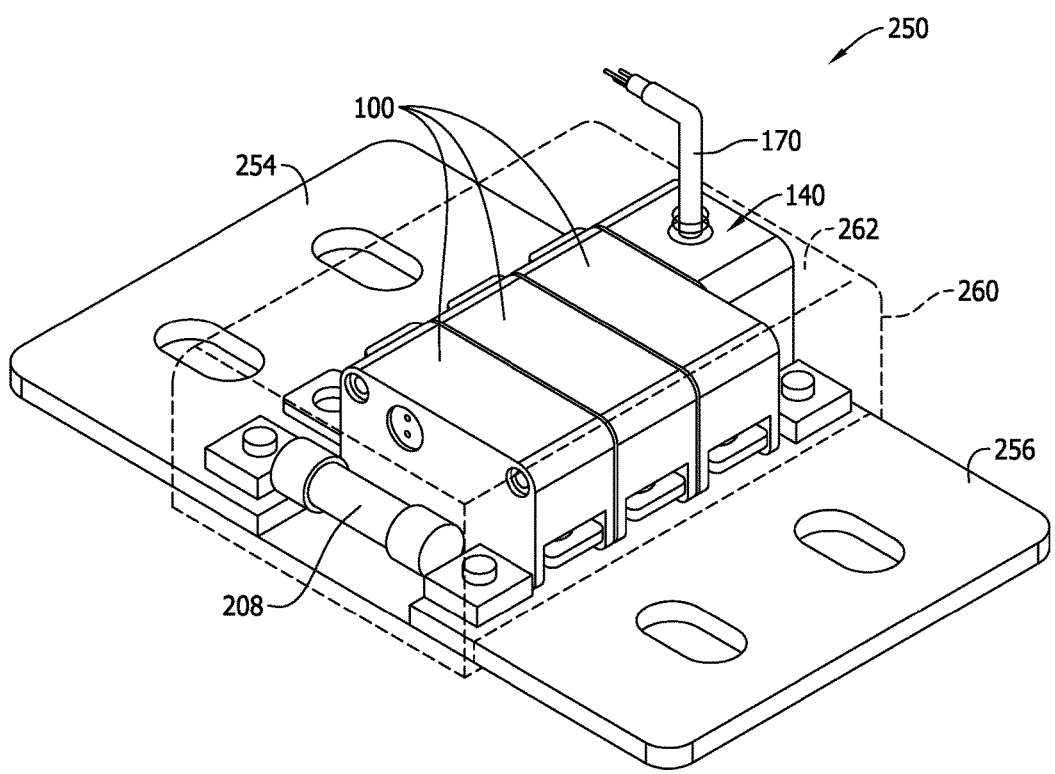
FIG. 6 is a perspective view of a second exemplary embodiment of a pyrotechnic circuit protection system according to the present invention including the pyrotechnic circuit protection modules of FIGS. 1 and 2 and the pyrotechnic control module shown in FIG. 3.

FIG. 6 is a perspective view of a second exemplary embodiment of a pyrotechnic circuit protection system 250 according to the present. The system 250 includes three pyrotechnic disconnect modules 100, a control module 140, and the optional arc mitigation fuse 208. The system 250 includes bus bar terminals 254, 256 that are larger than the bus bars 204, 206 of the system 200, but are otherwise similar.

The three pyrotechnic disconnect modules 100 are electrically connected one another and to the module 140 via the respective connectors 124, 126 described above. The three pyrotechnic disconnect modules 100 are electrically connected to one another in parallel between the bus bar terminals 254, 256 so that collectively they may accommodate a greater amount of current flowing between the bus bars 254, 256 than any individual one of the pyrotechnic disconnect modules 100 could individually handle. Compared to the system 200 (FIG. 4), the system 250 can accordingly operate with larger current input to achieve a higher amperage rating for the system 250.

As described above, either by itself or in response to an incoming signal from the cable 170, the pyrotechnic control module 140 may activate the pyrotechnic disconnect modules 100 independently or as a group. While three pyrotechnic disconnect modules 100 are shown, greater or fewer numbers of pyrotechnic disconnect modules 100 may be provided in further and/or alternative embodiments. The system 250 is also shown to include a housing base 260 and cover 262 that is larger than the housing base 210, 212 in the system 200, but otherwise is similar.

Figure 7:
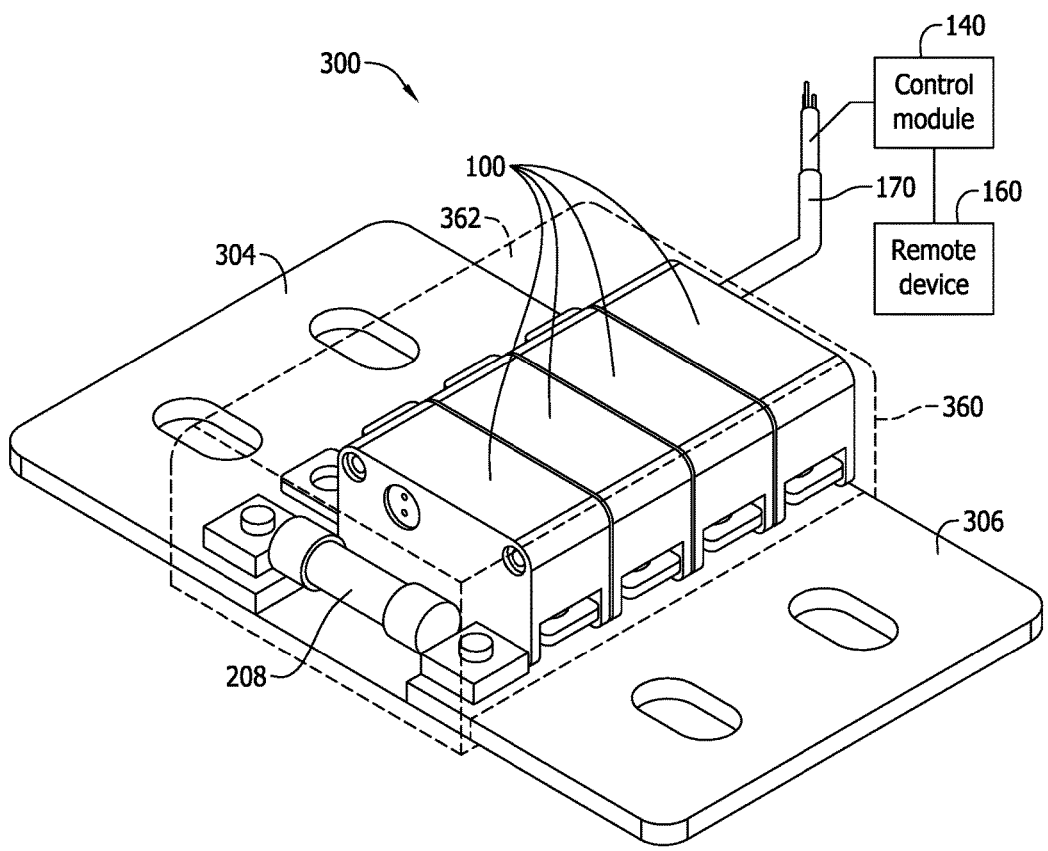
FIG. 7 is a perspective view of a third exemplary embodiment of a pyrotechnic circuit protection system according to the present invention including pyrotechnic circuit protection modules.

FIG. 7 is a perspective view of a third exemplary embodiment of pyrotechnic circuit protection system 300 according to the present invention.

The system 300 includes four pyrotechnic disconnect modules 100, and a control module 140 in communication with the pyrotechnic disconnect modules 100 via the cable 170. As such, the control module 140 may be located at a distance from the pyrotechnic disconnect modules 100. The cable 170 may be provided with corresponding connectors 124, 126 to plug the cable 170 into the pyrotechnic disconnect modules 100 on one end and to the pyrotechnic control module 140 on the other. The control module 140 may communicate with the remote device 160 via another cable 170. In some embodiments the remote device 160 could likewise be directly connected to the pyrotechnic disconnect modules 100 without utilizing the control module 140.

The system 300 also includes the optional arc mitigation fuse 208 for the same reasons previously explained. The system 300 includes bus bars terminals 304, 306 that are larger than the bus bars 254, 256 of the system 250, but are otherwise similar.

The four pyrotechnic disconnect modules 100 are electrically connected to one another via the respective connectors 124, 126 described above. The four pyrotechnic disconnect modules 100 are electrically connected to one another in parallel between the bus bar terminals 304, 306 so that collectively they may accommodate a greater amount of current flowing between the bus bars 304, 306 than any individual one of the pyrotechnic disconnect modules 100 could handle. Compared to the system 250 (FIG. 6), the system 300 can accordingly operate with larger current input to achieve a higher amperage rating for the system 300.

As described above, the pyrotechnic control module 140 and/or the remote device 160 may activate the disconnect elements 128 in the pyrotechnic disconnect modules 100 independently or as a group. While four pyrotechnic disconnect modules 100 are shown in FIG. 7, greater or fewer numbers of pyrotechnic disconnect modules 100 may be provided in further and/or alternative embodiments. The system 300 is also shown to include a housing base 360 and cover 362 that is larger than the housing base 210, 212 in the system 200, but otherwise is similar.

Figure 8:
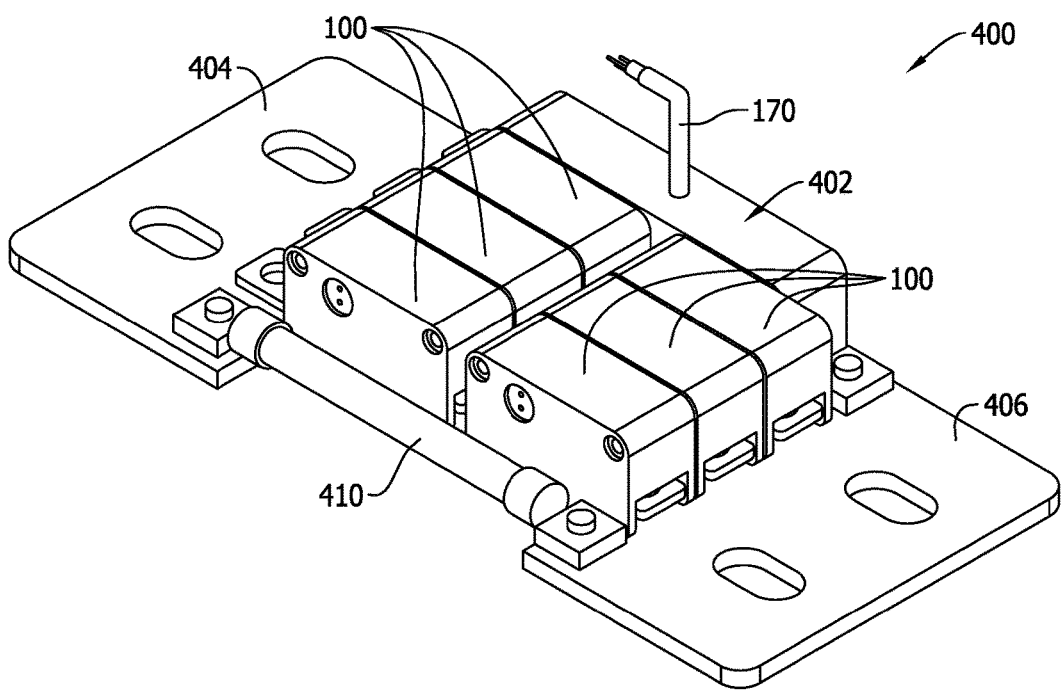
FIG. 8 is a perspective view of a fourth exemplary embodiment of a pyrotechnic circuit protection system according to the present invention including pyrotechnic circuit protection modules shown in FIGS. 1 and 2 with another exemplary embodiment of a pyrotechnic control module.

FIG. 8 is a perspective view of a fourth exemplary embodiment of pyrotechnic circuit protection system 400 according to the present invention including six pyrotechnic disconnect modules 100, and another exemplary embodiment of a pyrotechnic control module 402 in communication with the pyrotechnic disconnect modules 100 via the cable 170.

The six pyrotechnic disconnect modules 100 are shown to be connected in three pairs of series connected modules 100 between bus bar terminals 404, 406. This arrangement allows the system 400 to operate at higher voltages and/or to provide system redundancy and improved reliability.

Figure 9:
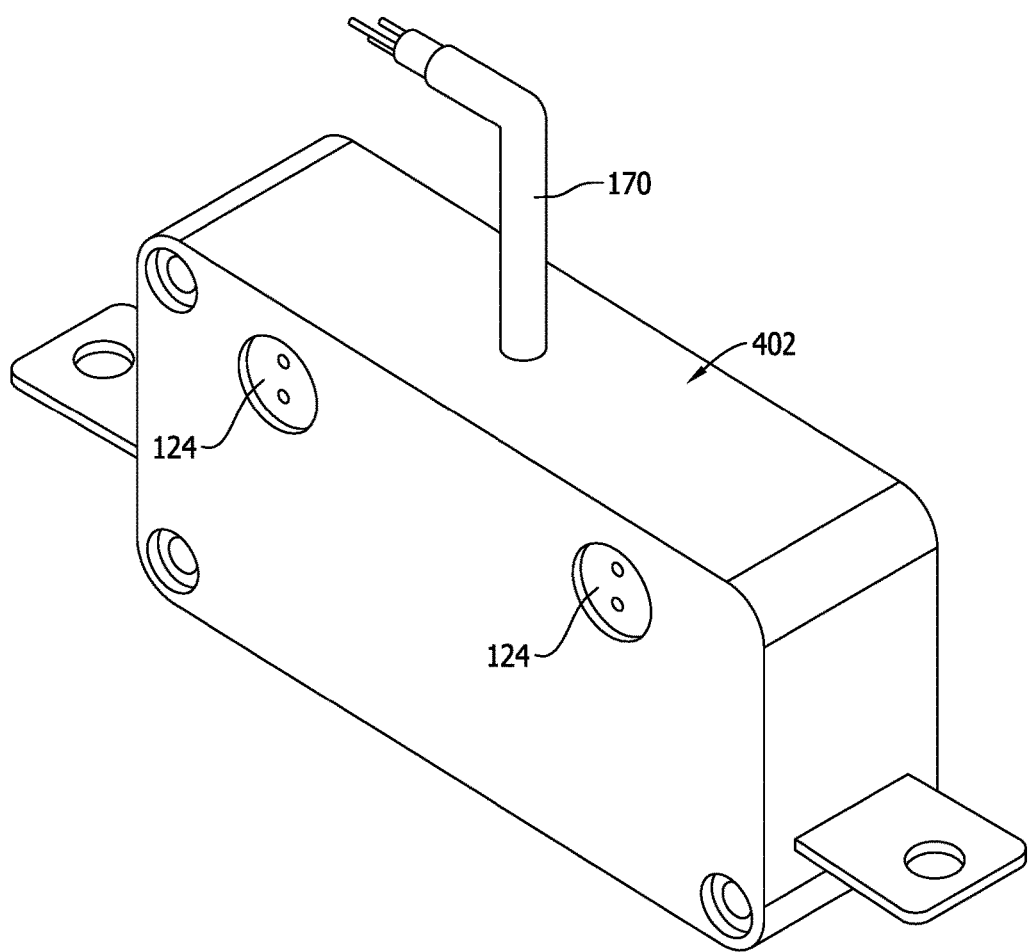
FIG. 9 is a perspective view of the pyrotechnic control module shown in FIG. 8.

The connector 124, 126 of each module 100 in the system 400 is mated with the connector 124, 126 of the adjacent module in each pair of series connected modules 100. As such, the three modules 100 on the left hand side in FIG. 8 are connected to one another via the module connectors 124, 126, and so are the three modules 100 on the right hand side. Each group of three connected modules 100 is further connected to the control module 402, which as shown in FIG. 9, includes two connectors 124 instead of one connector 124 as in the module 140 described above. The module 402 is proportionately larger than the module 140 to span the two groups of modules 100 shown in FIG. 400. The module 402, is functionally similar to module 140 in use to output trigger command signals to activate the disconnect elements 128 in the pyrotechnic disconnect modules 100 when desired. The two connectors 124 in the control module 402 provide dual outputs, one to each group of three connected modules 100 in the system 400.

Like the module 140 described above, the control module 402 either by itself or in response to an incoming signal from the cable 170, may activate the pyrotechnic disconnect modules 100 independently or as a group. While three pyrotechnic disconnect modules 100 are shown in each group, greater or fewer numbers of pyrotechnic disconnect modules 100 may be provided in further and/or alternative embodiments. A housing base and cover similar to those described above in the previous systems may optionally be utilized in the system 400 as desired.

The system 400 also includes an optional arc mitigation fuse 410 that is larger and operable under higher voltage than the fuse 208 or 128 in the systems 200, 250, 300 described above, but otherwise serves the same purpose. The system 400 includes bus bar terminals 404, 406 that are larger than the bus bars 204, 206 of the system 200, but are otherwise similar.

Figure 10:
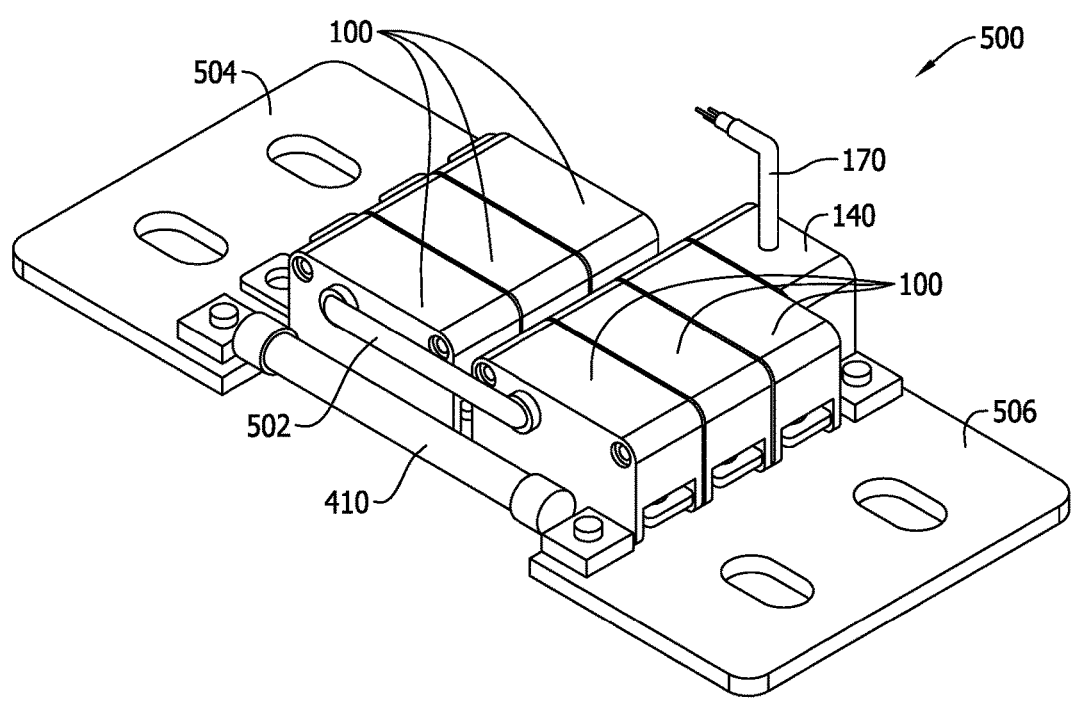
FIG. 10 is a perspective view of a fifth exemplary embodiment of a pyrotechnic circuit protection system according to the present invention including pyrotechnic circuit protection modules shown in FIGS. 1 and 2 with a pyrotechnic control module shown in FIG. 3.

FIG. 10 is a perspective view of a fifth exemplary embodiment of pyrotechnic circuit protection system 500 according to the present invention.

The system 500 includes series-connected disconnect modules 100 in connected groups of three as in the system 400. Instead of using the dual output control module 402 of the system 400, the system 500 uses the control module 140 connected to one of the groups of modules via the connectors 124, 126, and a jumper element 502 connecting the two groups of connected modules 100 in series with one another for control purposes. The jumper element 502 in contemplated embodiments includes a set of connectors 124 or 126 to facilitate the series connection of the modules 100 as shown.

The control module 140, either by itself or in response to an incoming signal from the cable 170, may activate the pyrotechnic disconnect modules 100 independently or as a group. While three pyrotechnic disconnect modules 100 are shown in each group, greater or fewer numbers of pyrotechnic disconnect modules 100 may be provided in further and/or alternative embodiments.

The system 500 also includes the optional arc mitigation fuse 410. The system 500 includes bus bar terminals 504, 506 that are larger than the bus bars 204, 206 of the system 200, but are otherwise similar. A housing base and cover similar to those described above in the previous systems may optionally be utilized in the system 500 as desired.

Figure 11:
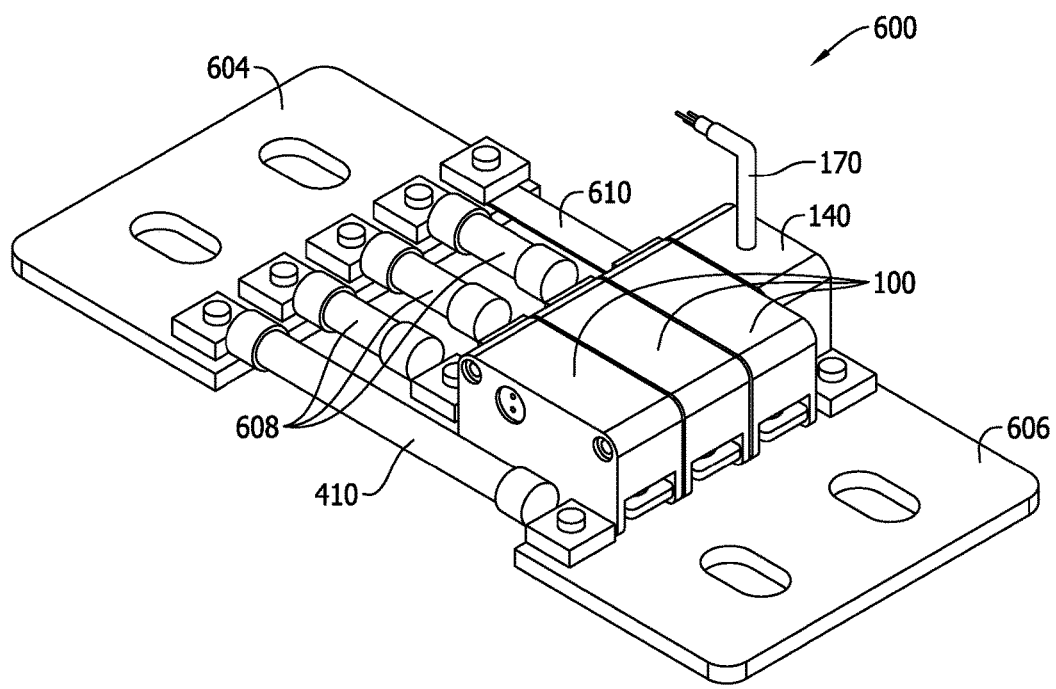
FIG. 11 is a perspective view of a sixth exemplary embodiment of a pyrotechnic circuit protection system according to the present invention including the pyrotechnic circuit protection modules shown in FIGS. 1 and 2 with a pyrotechnic control module shown in FIG. 3.

FIG. 11 is a perspective view of a sixth exemplary embodiment of a pyrotechnic circuit protection system 600 according to the present invention.

The system 600 includes the control module 140 and three pyrotechnic disconnect modules 100 interconnected to one another by the connectors 124, 126. Full voltage and amperage limiters 608 are connected in series with each disconnect module 100 between bus bar terminals 604, 606. The limiters 608 may be current limiting fuses that provide mechanical backup for the control module 140 in an electrical fault condition and/or aid in arc mitigation with the optional arc limiting fuse 410. Other types of current limiters are known, however, and may be utilized for similar purposes. A contact bridge 610 is also shown to connect the control module 140 to the bus bar 604. A housing base and cover similar to those described above in the previous systems may optionally be utilized in the system 600 as desired.

It should now be evident that still further variations of pyrotechnic circuit protection systems may easily be assembled by adding or subtracting disconnect modules and varying the interconnections between them and the other elements described. Having now described the modules 100, 140 and 402, those in the art may construct control circuitry to implement the controls without further explanation. Any programming of a controller may be accomplished using appropriate algorithms and the like to provide the desired effects, which is believed to be within the purview of those in the art.

Relative to existing pyrotechnic circuit protection devices and systems, the pyrotechnic circuit disconnect modules, pyrotechnic control modules and configurable systems including the same facilitate a desirability and expanded use of pyrotechnic disconnect features in at least the following aspects.

The configurable pyrotechnic circuit protection system of the invention readily facilitates the use of pyrotechnic disconnection features in Arcflash Reduction Maintenance Systems (ARMS) now in use in different types of fuse platforms, but not readily compatible with conventional pyrotechnic disconnect devices.

Various different pyrotechnic circuit protection systems of the invention, including but not limited to the examples above, are easily configurable for many applications with a small number of standard modular devices and modular components. A large variety of different systems can be assembled that meet various different needs for particular applications without customization and related expenses and difficulty. The configurable pyrotechnic circuit protection systems of the invention with modular components reduces, if not eliminates, a need to develop a new pyrotechnic disconnect feature for different applications.

The modular pyrotechnic components provide advantageous economies of scale that reduce costs of providing pyrotechnic disconnect features, as well as simplifies inventories of parts needed to provide a full spectrum of systems for a vast variety of different applications presenting different needs.

The use of pyrotechnic disconnect features in the proposed systems advantageously facilitates circuit protection systems operable with lower resistance for fusible applications. Consequently, the systems of the invention are operable with lower Watts loss, cooler operation, and improved cycle/fatigue life for fusible applications The proposed pyrotechnic circuit protection systems of the invention facilitate management and coordination of multi-phases of multi-phase power systems, and eliminate undesirable single phase disconnection events in the multi-phase power system.

The built-in control functionality of the pyrotechnic actuation of the invention provides easy and convenient interconnection capability that reduces installation costs and complexity of otherwise individually installed and stand-alone pyrotechnic circuit protection devices. The control functionality of the pyrotechnic actuation provides ease of connection and networking of the proposed configurable pyrotechnic protection systems with other systems (e.g., an arc sensing system as one example). Remote operation of the control functionality of the pyrotechnic protection system is likewise facilitated by interconnection of multiple modular pyrotechnic protection devices to a single control module.

Referring now to FIGS. 12-17, particular implementations of pyrotechnic disconnect modules 100 (FIGS. 2 and 3) will now be described to meet the needs of a particular electrical power system, such as, for example, a solar photovoltaic electrical power system. Specifically, new requirements in the National Electrical Code's (NEC) section 690.12 specify a rapid, remote shutdown of a rooftop photovoltaic (PV) power system with a disconnect located within 10 ft (3.048 m) of a solar array. Practically, this entails an inexpensive and very reliable means to disconnect the power from the PV array to the rest of the building in event of an emergency. It also must be very low resistance to prevent power loss in the circuit. The pyrotechnic circuit protection modules 100 described above provide economical solutions to meet the needs of NEC section 690.12 in various different combinations and assemblies as described below.

Figure 12:
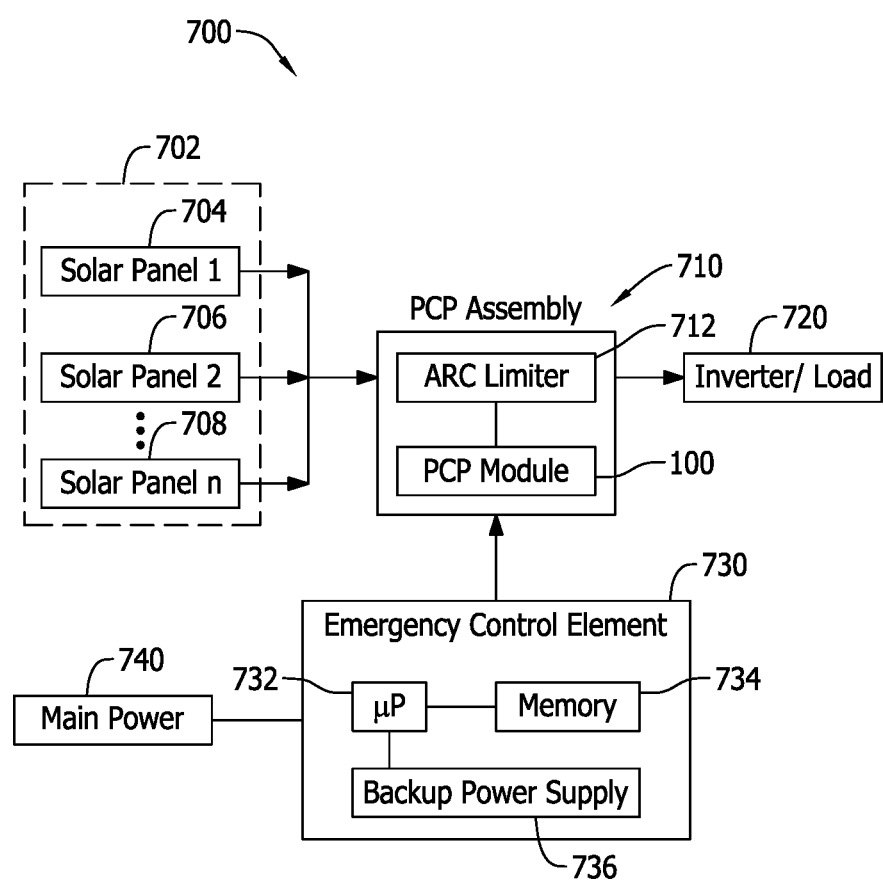
FIG. 12 is a block diagram of a pyrotechnic circuit protection system according to an exemplary embodiment of the present invention.

FIG. 12 is a block diagram of a pyrotechnic circuit protection system 700 according to an exemplary embodiment of the present invention. The system 700 includes a solar array 702 including a number of photovoltaic solar panels 704, 706 and 708. Any number n of solar panels may be used in the solar array 702, and in some embodiments a single solar panel may be provided. The photovoltaic solar panels 704, 706 and 708 in the solar array 702 each include solar modules or solar cells that convert light energy from the sun to electricity according to well-known photovoltaic principles and effect. The electricity produced by each solar panel 704, 706 and 708 is combined and passed through a photovoltaic circuit protection (PCP) assembly 710 to an inverter or other load 720 in the power system.

The pyrotechnic circuit protection (PCP) assembly 710 includes at least one pyrotechnic circuit protection module 100 and an optional arc limiter 712 as more specifically described in the examples below. The at least one pyrotechnic circuit protection module 100 is in communication with an emergency control element 730 to ensure a rapid, remote shutdown of the solar array 702 via the (PCP) assembly 710.

In a contemplated embodiment, the emergency control element 730 may include a processor-based microcontroller including a processor 732 and a memory storage 734 wherein executable instructions, commands, and control algorithms, as well as other data and information required to satisfactorily operate as described are stored. As noted above, a "processor-based" microcontroller shall refer not only to controller devices including a processor or microprocessor as shown, but also to other equivalent elements such as microcomputers, programmable logic controllers, reduced instruction set (RISC) circuits, application specific integrated (ASIC) circuits and other programmable circuits, logic circuits, equivalents thereof, and any other circuit or processor capable of executing the functions described herein. The memory of the processor-based device may be, for example, a random access memory (RAM), and other forms of memory used in conjunction with RAM memory, including but not limited to flash memory (FLASH), programmable read only memory (PROM), and electronically erasable programmable read only memory (EEPROM). The processor-based devices listed above and the forms of memory listed above are exemplary only, and are thus not intended to limit in any way the definition and/or meaning of the term "processor-based". As explained below, the emergency control element 730 provides actuation signal(s) to the module(s) 100 in the pyrotechnic circuit protection (PCP) assembly 710 to ensure safe and effective shut down of the system to disconnect the solar array 702 from the load 720.

As also shown in FIG. 12, the emergency control element 730 includes a backup power supply 736 that may operate the controller in the absence of operation of a mains power supply 740. In contemplated embodiments, the backup power supply 736 may include a battery power supply, a supercapacitor or other energy storage device to power the processor-based microcontroller and provide the actuation control signal(s) to shut down the solar array 702 in an emergency. The emergency control element 730 may receive signals from sensors such as those described above for automated operation and/or may be responsive to manual activation to provide the control signals to shut down the system in response to an emergency condition.

Figure 13:
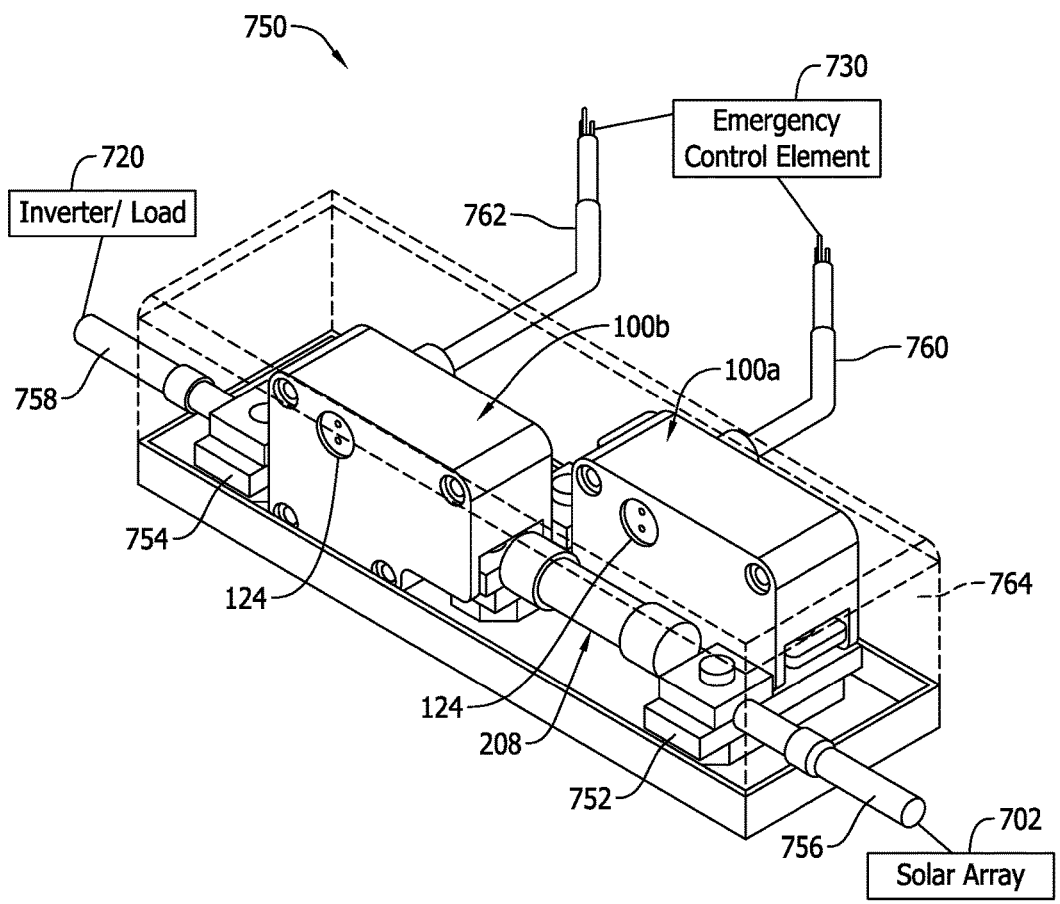
FIG. 13 is a perspective view of a first exemplary embodiment of a pyrotechnic circuit protection assembly for the system shown in FIG. 12 and including the pyrotechnic circuit protection modules shown in FIGS. 1 and 2.

FIG. 13 is a perspective view of a first exemplary embodiment of a pyrotechnic circuit protection assembly 750 that may be utilized as the pyrotechnic circuit protection assembly 710 in the system 700 shown in FIG. 12.

The pyrotechnic circuit protection assembly 750 includes an input terminal 752 and an output terminal 754. A first pyrotechnic circuit protection module 100a is connected to the input terminal 752 via the terminal 106 of the module 100a and connected to the output terminal 754 via the terminal 104 thereof. An arc mitigation fuse 208 is connected to the input terminal 752 and electrically in parallel with the first module 100a as shown, and a second pyrotechnic circuit protection module 100b is connected in-line or in series with the arc mitigation fuse 208. The arc mitigation fuse 208 is further connected to the output terminal 754. Each component shown is fastened individually to the terminals provided in any known manner, including but not limited to the use of bolts and screws, as well as soldered, brazed, or welded connections in various exemplary embodiments.

When utilized in the system 700, an input wire 756 connects the solar array 702 and the input terminal 752, and an output wire 758 connects the output wire to the inverter or load 720. A first control wire 760 connects the first pyrotechnic module 100a to the emergency control element 730, and a second control wire 762 connects the first pyrotechnic module 100b to the emergency control element 730. The control wires 760, 762 may be connected to each of the first and second modules 100a, 100b via the connectors 126 (FIG. 2). A nonconductive housing 764 protects the inner assembly with the wires 756, 758, 760, 762 passing through the housing 764 as shown.

In normal operation, the first pyrotechnic disconnect module 100a provides a very low resistance circuit path in operation and serves like a bus bar in the circuit completed through the input and output wires 756, 758. The arc mitigation fuse 208, by contrast, provides a high resistance current path such that practically all of the current from the input wire 756 flows through the first pyrotechnic disconnect module 100a and the second pyrotechnic disconnect module 100b while the arc mitigation fuse 208 has practically no current flowing through it in normal operation.

In the case of an emergency, and while the photovoltaic system is operating the emergency control element 730 sends a control signal via the first control wire 760 to activate the first pyrotechnic disconnect module 100a. As the first module 100a operates to disconnect the path through the module 100a, the current load of the module 100a is imposed on the arc mitigation fuse 208. The second pyrotechnic disconnect module 100b that is in line with the fuse 208 also briefly takes the load as the first disconnect module 100a opens and while the fuse 208 operates to quench the arc at high voltage. Once the fuse 208 opens, an open circuit is created between the input terminal 752 and the output terminal 754 and the system is safely shut down.

If the emergency conduction occurs when the solar array 702 is not operating (e.g., at night time) the control signal sent to the first pyrotechnic disconnect module 100a and corresponding activation of the first pyrotechnic disconnect module 100a will not result in opening of the arc mitigation fuse 208 as there is no current load in this scenario. Accordingly, the second pyrotechnic disconnect module 100b is timed to open after the first module 100a by the emergency control element 730. In contemplated embodiments, when an emergency condition is present, the emergency control element 730 sends a first signal via the wire 760 to activate and open the first pyrotechnic disconnect module 100a, and after a predetermined time delay such as about one second in a contemplated embodiment the emergency control element sends a second signal via the wire 762 to activate and open the second pyrotechnic disconnect module 100b. By activating the second pyrotechnic disconnect module 100b after the first pyrotechnic disconnect module 100a, safe shut down is affected whether or not the solar array 702 is operating at the time, and the emergency control element 730 need not know or distinguish operational or non-operational conditions of the solar array 702.

Figure 14:
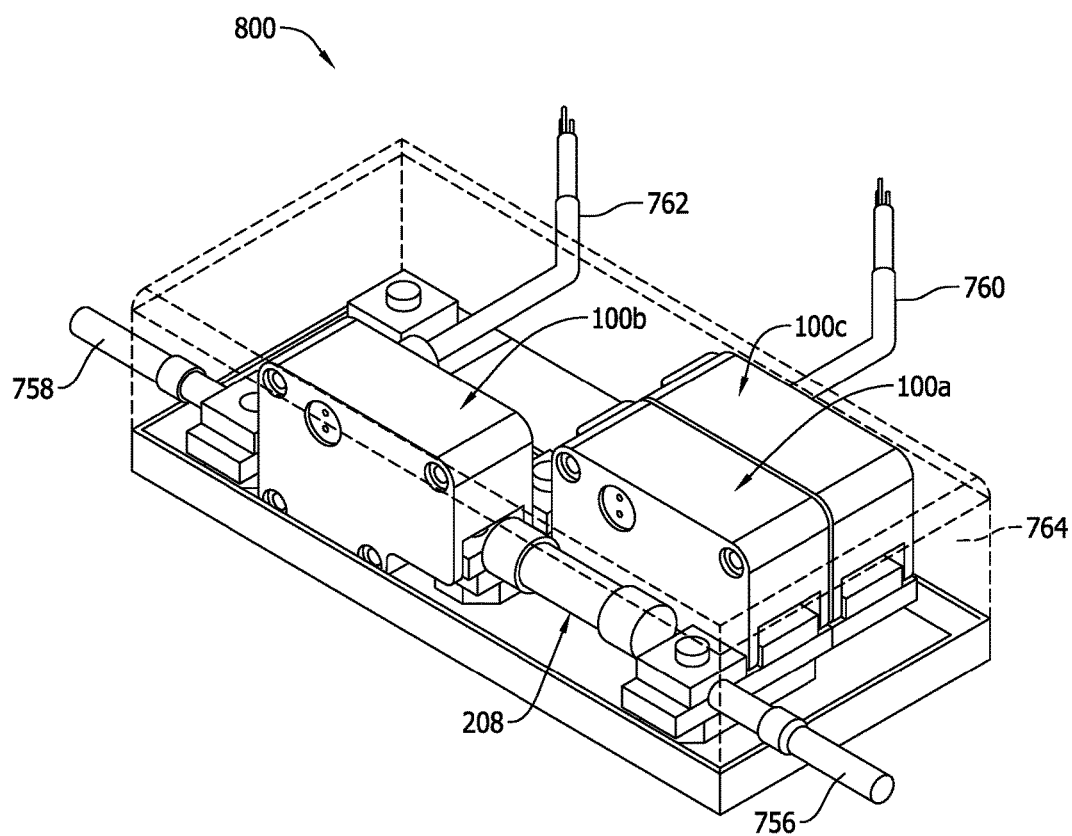
FIG. 14 is a perspective view of a second exemplary embodiment of a pyrotechnic circuit protection assembly for the system shown in FIG. 12 and including the pyrotechnic circuit protection modules shown in FIGS. 1 and 2.

FIG. 14 is a perspective view of a second exemplary embodiment of a pyrotechnic circuit protection assembly 800 that may be utilized as the pyrotechnic circuit protection assembly 710 in the system 700.

The assembly 800 is seen to be similar to the assembly 750 (FIG. 13) but includes a third pyrotechnic circuit protection module 100c connected to the module 100a. The modules 100a and 100c are connected to one another via the connectors 124, 126 provided in each module such that the modules 100a and 100c are electrically connected in parallel to one another, and the control wire 760 is connected to the module 100c.

The addition of the third module 100c provides for increased amperage capability relative to the assembly 750 including only one module 100a connected in parallel to the fuse 208 and the second pyrotechnic circuit protection module 100b. While two modules 100a and 100c are shown in the example of FIG. 14, additional modules 100 could likewise be added in parallel for increased amperage operation.

Operation of the assembly 800 is similar to the assembly 750. In an emergency, and while the solar array 702 is operating, the emergency control element 730 sends a first signal via the wire 760 that is received by each of the pyrotechnic circuit protection modules 100a and 100c. Each of the modules 100a and 100c activates and opens, passing the current load to the fuse 208 until it opens. In the event that the solar array 702 is not operating, the emergency control element 720 sends a second signal via the wire 762 at a predetermined time after the first control signal is sent, causing the second pyrotechnic circuit protection module 100b to open.

Figure 15:
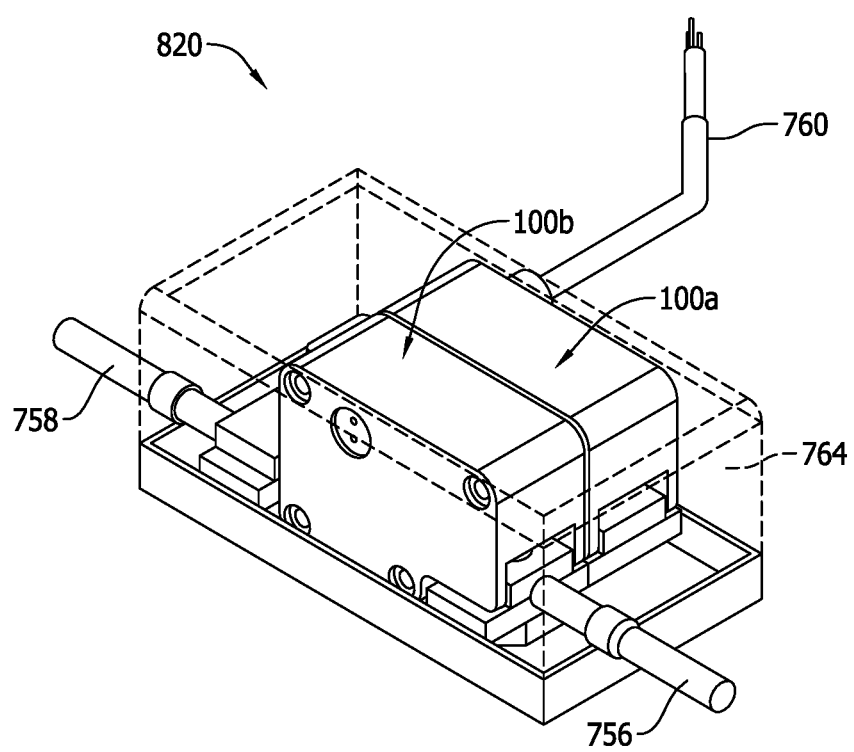
FIG. 15 is a perspective view of a third exemplary embodiment of a pyrotechnic circuit protection system according to the present invention including the pyrotechnic circuit protection modules shown in FIGS. 1 and 2.

FIG. 15 is a perspective view of a third exemplary embodiment of pyrotechnic circuit protection assembly 820 that may be utilized as the pyrotechnic circuit protection assembly 710 in the system 700.

The assembly 820 may be recognized as similar to the assembly 750 (FIG. 13) but omitting the arc mitigation fuse 208. As such, the pyrotechnic circuit protection modules 100a and 100b are connected in parallel via the mating connectors 124, 126 provided in each module. Because of the ganged modules 100a, 100b, only one control wire 760 is provided to connect to the module 100a. In an emergency, a signal is provided via the control wire 760 that is received by each of the modules 100a and 100b, causing them to activate and open at about the same time. The enclosure defined by the housing 764 may be filled with sand or other arc quenching media to contain arc energy when the disconnect modules 100a, 100b actuate under load. In the event that no load exists because the solar array 702 is not operating at the time of the emergency, no arcing occurs but an open circuit in the assembly 820 is nonetheless created as the modules 100a, 100b are activated.

Figure 16:
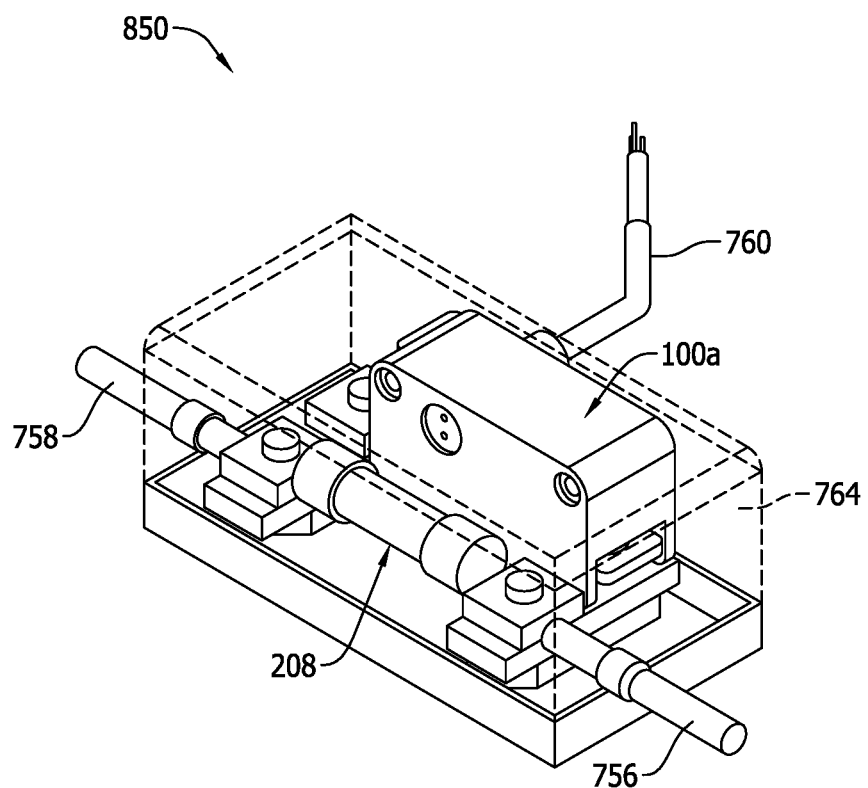
FIG. 16 is a perspective view of a fourth exemplary embodiment of a pyrotechnic circuit protection system according to the present invention including the pyrotechnic circuit protection modules shown in FIGS. 1 and 2.

FIG. 16 is a perspective view of a fourth exemplary embodiment of a pyrotechnic circuit protection assembly 850 that may be utilized as the pyrotechnic circuit protection assembly 710 in the system 700.

The assembly 850 may be recognized as similar to the assembly 750 (FIG. 13) but omitting the second pyrotechnic circuit protection module 100b. This arrangement would operate normally when the PV system is energized as described above. In the case where the PV system is generating zero current or very close to zero current (e.g., at night time) the fuse 208 would not open. As such, if the system is shut down at night via the assembly 850, unless disconnected by other means, current may once again pass through the assembly 820 via the fuse 208 after the module 100a has been opened when the solar array 702 resumes operation. As such, the emergency control element 730 may desirably send a notification or alert to effect an alternative disconnection or shut down to avoid any possible adverse consequence.

The assemblies and systems described above facilitate a very simple and reliable remote shutdown in view of NEC 2014 690.12 that requires Rapid Shutdown of PV Systems on Buildings. The assemblies are also operable with lower resistance than conventionally employed mechanical contacts in conventional disconnect switches. The assemblies are operable with no mechanical parts and are therefore highly reliable. The assemblies including the modular pyrotechnic circuit protection modules facilitate remote indication features with relative ease, and the modular pyrotechnic circuit protection modules are easily integrated into existing controls.

The benefits and advantages of the inventive concepts are now believed to have been amply illustrated in relation to the exemplary embodiments disclosed.

A modular pyrotechnic circuit protection system has been disclosed including: an input terminal; an output terminal; and at least one disconnect module electrically connected between the input terminal and the output terminal. The at least one disconnect module includes: a nonconductive housing comprising opposed side surfaces; a first electrical connector on one of the opposed side surfaces; a second electrical connector on the other of the opposed side surfaces; a pyrotechnic disconnect element inside the nonconductive housing and electrically connected to at least one of the first and second electrical connectors; and first and second terminals coupled to the respective input terminal and output terminal; and an arc mitigation element connected in parallel with the at least one disconnect module between the input terminal and the output terminal.

Optionally, the system may further include an emergency control element in communication with the at least one disconnect module via one of the first and second electrical connectors. The arc mitigation element may be an electrical fuse. The first electrical connector may be a male connector, the second electrical connector may be a female connector, and a pass through electrical connection from the first electrical connector to the second electrical connector may be established in the nonconductive housing of the at least one disconnect module. The at least one disconnect module may include at least two disconnect modules connected in parallel via one of the first and second electrical connectors.

As further options, the at least one disconnect module may include at least two disconnect modules, and one of the at least two disconnect modules may be connected in series with the arc mitigation element. The system may further include an emergency control element in communication with each of the at least two disconnect modules, the emergency control element configured to: generate a first control signal to operate the pyrotechnic disconnect element inside one of the at least two disconnect modules; and after a predetermined time delay, generate a second control signal to operate the pyrotechnic disconnect element inside the other one of the at least two disconnect modules.

Another embodiment of a modular pyrotechnic circuit protection system has been disclosed including: a housing; an input terminal; an output terminal; and at least two disconnect modules electrically connected between the input terminal and the output terminal inside the housing. Each of the at least two disconnect modules includes: a nonconductive housing having opposed side surfaces; a first electrical connector on one of the opposed side surfaces; a second electrical connector on the other of the opposed side surfaces; and a pyrotechnic disconnect element inside the nonconductive housing and electrically connected to at least one of the first and second electrical connectors.

Optionally, the system may further include an arc extinguishing media surrounding the at least two disconnect modules inside the housing. The system may also include an arc mitigation element electrically connected in parallel with at least one of the at least two disconnect modules inside the housing, or an arc mitigation element electrically connected in series with at least one of the at least two disconnect modules between the input terminal and the output terminal. The system may include an emergency control element in communication with each of the at least two disconnect modules, the emergency control element configured to: generate a first control signal to operate the pyrotechnic disconnect element inside one of the at least two disconnect modules; and after a predetermined time delay, generate a second control signal to operate the pyrotechnic disconnect element inside the other one of the at least two disconnect modules.

As further options, the system may also include an electrical fuse connected in series with one of the at least two at least two disconnect modules and also connected in parallel with the other one of the at least two disconnect modules. The first electrical connector may be a male connector, the second electrical connector may be a female connector, and a pass through electrical connection may be established in the housing from the first electrical connector to the second electrical connector. The at least two disconnect modules may be connected in parallel via respective ones of the first electrical connector and second electrical connector in each of the at least two disconnect modules.

A photovoltaic circuit protection system has also been disclosed including: a solar photovoltaic power system having at least one solar panel; a first connection terminal connected to the at least one solar panel; a second connection terminal connected to an electrical load; and a plurality of disconnect modules connected between the first and second connection terminals. Each of the plurality of disconnect modules include: a nonconductive housing comprising opposed side surfaces; a first electrical connector on one of the opposed side surfaces; a second electrical connector on the other of the opposed side surfaces; a pyrotechnic disconnect element inside the nonconductive housing and electrically connected to at least one of the first and second electrical connectors; and an emergency control element connected to each of the plurality of pyrotechnic modules via one of the first and second electrical connectors.

Optionally, the plurality of disconnect modules may include at least two disconnect modules connected in parallel to one another via respective ones of the first and second electrical connectors. The system may further include an arc mitigation element connected in series with at least one of the plurality of disconnect modules. The plurality of disconnect modules may be surrounded by an arc extinguishing media. The emergency control element may be configured to: generate a first control signal to operate the pyrotechnic disconnect element inside a first one of the plurality of disconnect modules; and after a predetermined time delay, generate a second control signal to operate the pyrotechnic disconnect element inside a second one of the plurality of disconnect modules. The system may include an arc mitigation element connected in parallel to at least one of the plurality of pyrotechnic modules. The system may also include a housing, with the plurality of pyrotechnic modules inside the housing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A modular pyrotechnic circuit protection system comprising:
    an input terminal;
    an output terminal; and
    at least one disconnect module electrically connected between the input terminal and the output terminal;
    wherein the at least one disconnect module comprises:
        a nonconductive housing comprising opposed first and second lateral side surfaces and opposed first and second longitudinal side surfaces interconnecting the lateral side surfaces;
        a dual prong male electrical connector on the first longitudinal side surface to establish a control connection via a first prong of the dual prong male electrical connector and to establish a pass through electrical connection via a second prong of the dual prong male electrical connector;
        a dual prong female electrical connector on the second longitudinal side surface to establish a control connection via a first prong of the dual prong female electrical connector and to establish a pass through electrical connection via a second prong of the dual prong female electrical connector;
        a pyrotechnic disconnect element inside the nonconductive housing and electrically connected to the first prong of the dual prong male electrical connector or the first prong of the dual prong female electrical connector;
        a first terminal extending from the first lateral side and coupled to the input terminal;

a second terminal extending from the second lateral side and coupled to the output terminal; and
an arc mitigation element connected in parallel with the at least one disconnect module between the input terminal and the output terminal.

2. The system of claim 1, further comprising an emergency control element in communication with the at least one disconnect module via the dual prong male electrical connector or the dual prong female electrical connector.

3. The system of claim 1, wherein the arc mitigation element comprises an electrical fuse.

4. The system of claim 1, wherein the at least one disconnect module includes at least two disconnect modules mechanically and electrically connected in parallel to one another via mating engagement of the dual prong male electrical connector or the dual prong female electrical connector of the at least two disconnect modules.

5. The system of claim 1, wherein the at least one disconnect module includes first and second disconnect modules connected to one another via mated ones of the respective male and female dual prong electrical connectors.

6. The system of claim 5, further comprising an emergency control element in communication with each of the at least two disconnect modules via the mated male and female dual prong electrical connectors, the emergency control element configured to:
generate a first control signal to operate the pyrotechnic disconnect element inside the first disconnect module; and
after a predetermined time delay, generate a second control signal to operate the pyrotechnic disconnect element inside the second disconnect module.

7. A modular pyrotechnic circuit protection system comprising:
a housing;
an input terminal;
an output terminal; and
at least two disconnect modules electrically connected between the input terminal and the output terminal inside the housing, wherein each of the at least two disconnect modules comprises:
a nonconductive housing comprising opposed first and second lateral side surfaces and opposed first and second longitudinal side surfaces interconnecting the lateral side surfaces;
a dual prong male electrical connector on the first longitudinal side surface to establish a control connection and a pass through electrical connection on the first longitudinal side;
a dual prong female electrical connector on the second longitudinal side surface to establish a control connection and a pass through electrical connection on the second longitudinal side; and
a pyrotechnic disconnect element inside the nonconductive housing and being responsive to a control signal supplied to one of the control connections on the first longitudinal side or the second longitudinal side.

8. The system of claim 7, further comprising an arc extinguishing media surrounding the at least two disconnect modules inside the housing.

9. The system of claim 7, further comprising an arc mitigation element electrically connected in parallel with at least one of the at least two disconnect modules inside the housing.

10. The system of claim 7, further comprising an arc mitigation element electrically connected in series with at least one of the at least two disconnect modules between the input terminal and the output terminal.

11. The system of claim 7, further comprising an emergency control element in communication with each of the at least two disconnect modules, the emergency control element configured to:
generate a first control signal to operate the pyrotechnic disconnect element inside a first one of the at least two disconnect modules; and
after a predetermined time delay, generate a second control signal to operate the pyrotechnic disconnect element inside a second one of the at least two disconnect modules.

12. The system of claim 7, further comprising an electrical fuse connected in series with a first one of the at least two disconnect modules and also connected in parallel with a second one of the at least two disconnect modules.

13. The system of claim 7, wherein the at least two disconnect modules are connected in parallel to one another between the input terminal and the output terminal, and wherein a mating engagement of the dual prong male electrical connector and the dual prong female electrical connector of the respective at least two disconnect modules simultaneously interconnects the control connection and the pass through electrical connection of each of the at least two disconnect modules.

14. A photovoltaic circuit protection system comprising:
a solar photovoltaic power system having at least one solar panel;
a first connection terminal connected to the at least one solar panel;
a second connection terminal connected to an electrical load;
a plurality of pyrotechnic disconnect modules connected between the first and second connection terminals, wherein each of the plurality of pyrotechnic disconnect modules includes:
a nonconductive housing comprising opposed first and second lateral side surfaces and opposed first and second longitudinal side surfaces interconnecting the lateral side surfaces;
a dual prong male electrical connector on the first longitudinal side surfaces to establish a control connection and a pass through electrical connection;
a dual prong female electrical connector on the second longitudinal side surfaces to establish a control connection and a pass through electrical connection;
a pyrotechnic disconnect element inside the nonconductive housing and electrically connected to the dual prong male electrical connector or the dual prong female electrical connector; and
an emergency control element connected to each of the plurality of pyrotechnic disconnect modules via one of the respective dual prong male and dual prong female electrical connectors.

15. The system of claim 14, wherein the plurality of pyrotechnic disconnect modules includes at least two pyrotechnic disconnect modules connected in parallel to one another and wherein a mated engagement of the respective dual prong male and dual prong female electrical connectors simultaneously interconnects the control connection and the pass through electrical connection of each of the at least two pyrotechnic disconnect modules.

16. The system of claim 14, further comprising an arc mitigation element connected in series with at least one of the plurality of pyrotechnic disconnect modules.

17. The system of claim 14, wherein the plurality of pyrotechnic disconnect modules are surrounded by an arc extinguishing media.

18. The system of claim 14, wherein the emergency control element is configured to:
generate a first control signal to operate the pyrotechnic disconnect element inside a first one of the plurality of pyrotechnic disconnect modules; and
after a predetermined time delay, generate a second control signal to operate the pyrotechnic disconnect element inside a second one of the plurality of pyrotechnic disconnect modules.

19. The system of claim 14, further comprising an arc mitigation element connected in parallel to at least one of the plurality of pyrotechnic disconnect modules.

20. The system of claim 14, further comprising a housing, the plurality of pyrotechnic disconnect modules inside the housing.

21. A modular pyrotechnic circuit protection system comprising:
at least one disconnect module comprising:
a nonconductive housing comprising opposed first and second lateral side surfaces and opposed first and second longitudinal side surfaces interconnecting the lateral side surfaces;
a dual prong male electrical connector on the first longitudinal side surface to establish a control connection via a first prong of the dual prong male electrical and to establish a pass through electrical connection via a second prong of the dual prong male electrical connector;
a dual prong female electrical connector on the second longitudinal side surface to establish a control connection via a first prong of the dual prong female electrical and to establish a pass through electrical connection via a second prong of the dual prong female electrical connector;
a pyrotechnic disconnect element inside the nonconductive housing and electrically connected to the first prong of the dual prong male electrical connector or the first prong of the dual prong female electrical connector;
a first terminal extending from the first lateral side;
a second terminal extending from the second lateral side.

* * * * *